(12) United States Patent
Koyama

(10) Patent No.: US 6,225,627 B1
(45) Date of Patent: May 1, 2001

(54) FOCUSED ION BEAM SYSTEM

(75) Inventor: Yoshihiro Koyama, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/264,142

(22) Filed: Mar. 5, 1999

(30) Foreign Application Priority Data

Mar. 6, 1998 (JP) .................................. 10-055270
Mar. 6, 1998 (JP) .................................. 10-055271

(51) Int. Cl.[7] ........................... H01J 37/256; H01J 37/10
(52) U.S. Cl. ........................................ 250/309; 250/396 R
(58) Field of Search ............................. 250/309, 396 R, 250/396 ML

(56) References Cited

U.S. PATENT DOCUMENTS 3,930,155 * 12/1975 Kanomata et al. .................. 250/309
5,731,586 * 3/1998 Takashima et al. ........... 250/396 ML
6,031,239 * 2/2000 Shi et al. ......................... 250/492.21

\* cited by examiner

Primary Examiner—Jack Berman
(74) Attorney, Agent, or Firm—Adams & Wilks

(57) ABSTRACT

A charged beam system is provided which includes: a focusing lens system for focusing an ion beam emitted from an ion source; scanning electrodes for applying the focused ion beam onto a predetermined area on a surface of a specimen while scanning the predetermined area on the surface of the specimen with the focused ion beam; a secondary charged particle detector for detecting secondary charged particles which are generated from the surface of the specimen by the application of the focused ion beam thereonto; and a display device for displaying thereon an image on the surface of the specimen on the basis of signals outputted from the secondary charged particle detector, wherein the lens system is made of a material which has corrosion resistance against a halogen series gas or high resistance resistors are inserted between the lens and a control power source for applying high voltages to the lens.

20 Claims, 1 Drawing Sheet

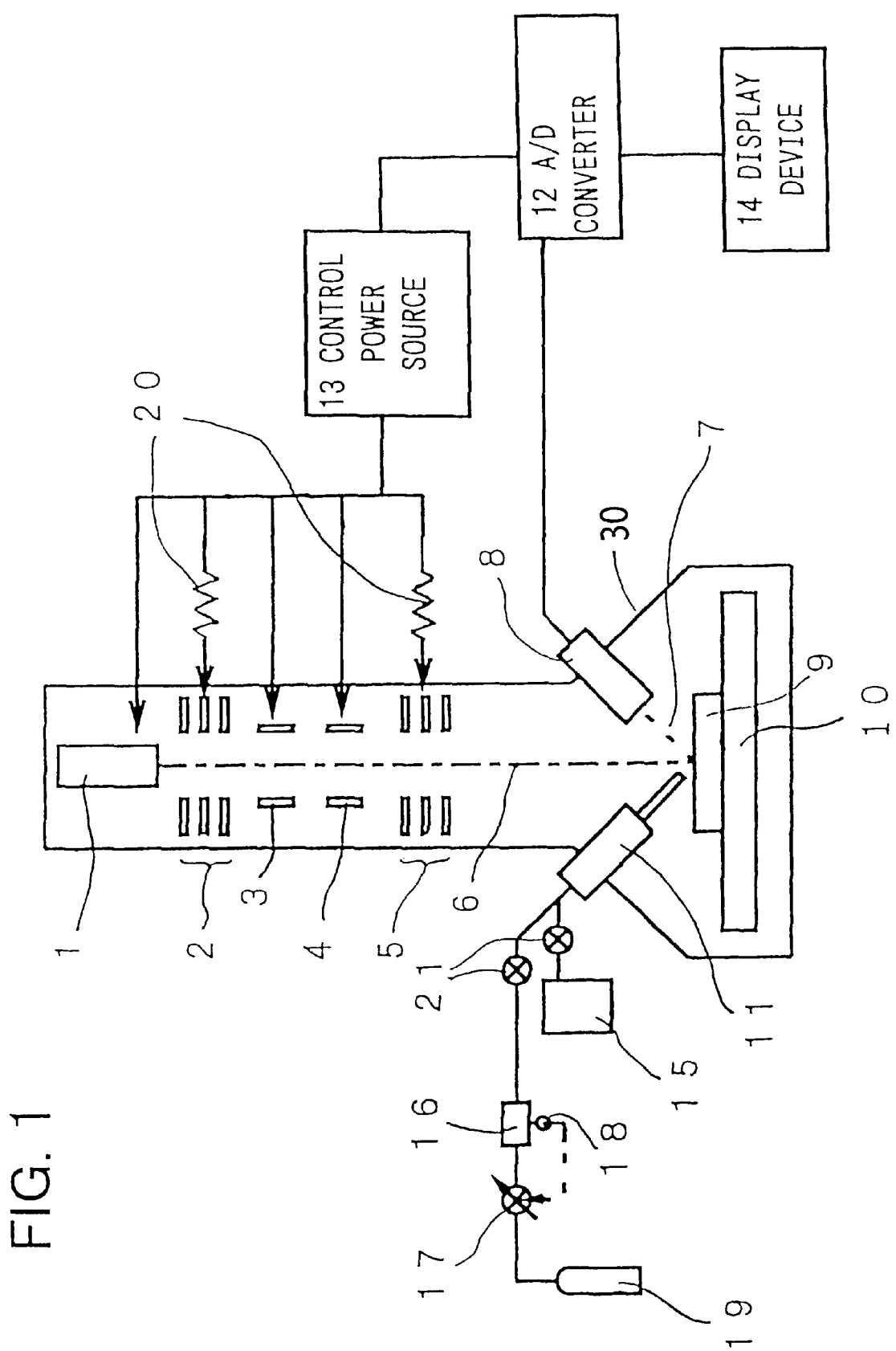

FOCUSED ION BEAM SYSTEM

BACKGROUND OF THE INVENTION

The present invention relates to a focused ion beam system by which a focused ion beam is applied onto a surface of a specimen, while scanning the surface of the specimen with the focused ion beam, and while spraying the surface of the specimen with gases, to thereby carrying out fine patterning.

Heretofore, in order to provide selectivity and increased sputtering rate in the etching process, the etching process is carried out while spraying a position on a surface of a specimen, which is being irradiated with a focused ion beam, with a local gas (commonly referring to as an assist gas). As for this assist gas, in order to provide the reactivity with a material of a specimen, a halogen series gas (for example, a chlorine gas) is mainly employed.

In addition, in order to focus the ion beam emitted from an ion source, there is provided a focusing lens (an electrostatic lens) including a condenser lens and an objective lens. Also, as for a material of each of the condenser lens and the objective lens, in terms of installation of those lenses in a vacuum and ease of processing of those lenses, a stainless steel material such as SUS304 is typically employed.

In the above-mentioned focused ion beam system, however, the etching assist gases react not only with the specimen, but also with focusing lens and the like made of a stainless steel material (i.e., the chemical etching occurs), and hence the surface of the focusing lens is roughened due to the chemical etching. In addition, the reactant is deposited on the surface of the focusing lens so that the irregularity of the surface of the focusing lens is increased. At this time, if applying a high voltage (several tens kV or so) to the focusing lens, then, there is provided the state in which the discharge is easy to be generated between the focusing lens and the earth.

If the discharge is generated during the processing, then the focused ion beam is applied to areas other than the predetermined area irradiated therewith, and this disables the desired processing and observation, respectively. In addition, a large amount of current is caused to flow through a control power source 13 due to the generation of the discharge so that the control power source 13 may be destroyed. Those are problems associated with the prior art for which a need arises to prevent undesired etching of and deposition onto the focusing lens of a system employing a focused ion beam.

SUMMARY OF THE INVENTION

In order to solve the above-mentioned problems inherent in the prior art, the state in which discharge occurs must be rarely generated. For this purpose, each of the lenses of a focused ion beam system is made of a material which is excellent in corrosion resistance against a halogen series gas. As an example thereof, hastelloy alloy or stellite alloy is suitable for such a corrosion resistant material.

Therefore, the etching assist gas has no corrosion behavior to each of the lenses to which a high voltage is applied, and hence does not roughen each of the lenses. As a result, no sharp tip is formed in each of the lenses, resulting in the discharge being hardly generated.

In addition, if discharge should be generated between the focusing lens and the earth, since resistors each having a high resistance value are made to lie in the circuit of interest, the amount of current which is caused to flow through the circuit of interest is reduced, and hence the discharge is generated in the form of the glow discharge. As a result, the control power source is not destroyed and also no discharge hole is formed in the focusing lens.

BRIEF DESCRIPTION OF THE DRAWING

FIG. 1 is a schematic cross sectional view showing the construction of a system according to an embodiment of the present invention.

DETAILED DESCRIPTION OF THE INVENTION

An embodiment of the present invention will hereinafter be described in detail with reference to the accompanying drawing.

FIG. 1 is a schematic cross sectional view showing the construction of an ion beam processing system according to an embodiment of the present invention. An ion source 1 for generating and projecting an ion beam downward is provided in a upper portion of a vacuum chamber 30. The ion source of a liquid metal such as liquid gallium is employed as the ion source 1. A condenser lens 2 and an objective lens 5 are provided onto the axis of the ion beam which is emitted from the ion source 1. Both of the condenser lens 2 and the objective lens 5 constitute a focusing lens and serve to focus the ion beam into a focused ion beam 6. The voltages which are to be applied to the condenser lens 2 and the objective lens 5 are supplied thereto under the control of a control power source 13. Each of the voltages which are applied to the condenser lens 2 and the objective lens 5 is a high voltage on the order of several tens of kV.

Each of the condenser lens 2 and the objective lens 5 constituting the focusing ion lens is made of either heat resistant and corrosion resistant alloy (its product name is well known as hastelloy alloy) which contains therein as the basic constituent nickel and molybdenum, or heat resistant and corrosion resistant alloy (its product name is well known as stellite alloy) which contains therein as the main constituent cobalt, chromium and tungsten. Alternatively, instead of employing such heat resistant and corrosion resistant alloy, a film which is made of titanium carbide, titanium nitride, silicon carbide or noble metal such as gold may be formed on the surface of the stainless steel material. The material of the lenses 2 and 5 or its surface processing material has stability against the etching gases which will be described later.

In addition, in order that a surface of a specimen 9 placed on a specimen stage 10 may be irradiated with the focused ion beam 6, the stage 10 on which the specimen 9 is to be placed is provided in such a way that its center portion is aligned with the axis of application of the focused ion beam 6. In addition, a secondary charged particle detector 8 for detecting secondary charged particles 7 (secondary electrons, secondary ions and the like) generated from the surface of the specimen 9 is arranged in the vicinity of the specimen 9 with its detection window directed to the upper surface of the specimen 9. A signal reflecting the secondary charged particles 7 which have been detected by the secondary charged particle detector 8 is input to a display device 14 through an A/D converter 12. Then, the display device 14 displays thereon an image of the surface of the specimen 9. In other words, the focused ion beam system of the present embodiment can carry out both of the observation and the processing of the specimen 9.

On the basis of the image of the surface of the specimen 9, the processing area of the specimen 9 is determined, and then the focused ion beam 6 is repeatedly applied to the processing area while scanning the processing area with the focused ion beam, thereby processing the surface of the specimen 9. The scanning area of the focused ion beam 6, which is a processing area, is set by controlling the voltage applied to scanning electrodes 4 which are provided in the periphery of the optical axis of the focused ion beam 6. The voltages which are respectively applied to the scanning electrodes 4 are supplied from the control power source 13. In addition, by the operation of blanking electrodes 3 which are provided in the periphery of the optical axis of the focused ion beam 6, the application of the focused ion beam 6 to the specimen 9 and the like is subjected to ON/OFF control.

In addition, the present system includes a gas gun 11 for spraying the area of the surface of the specimen 9, which is irradiated with the focused ion beam 9, with an assist gas for etching. The assist gas is filled in a reserver 15. In this connection, the conditions of the reserver 15 are set in such a way that the temperature of the reserver 15 is measured by a temperature sensor, e.g., a thermoelectric couple, and the temperature thus measured becomes the temperature at which the vapor pressure of the assist gas becomes the desired pressure. On the basis of the temperature of the reserver 15 thus measured, a heater is controlled by a temperature controller so that the temperature of the reserver 15 is controlled so as to be the desired temperature. When flowing the assist gas in the reserver 15, a valve 21 is opened and then the surface of the specimen 9 is sprayed with the assist gas through the gas gun 11. Then, the specimen 9 is subjected to the ion beam etching assist processing.

In addition, alternatively, the assist gas may be introduced not only from the reserver, but also from a gas unit for supplying a gas. Also, the gas unit is comprised of a tank 19 for storing therein gases, a buffer 16 for storing therein gases at a predetermined pressure, and a control valve 17 for adjusting the pressure in the gases which are stored in the buffer on the basis of the value indicated by a vacuum gauge for measuring the pressure in the buffer 16. The gas unit is used only in the case where the vapor pressure of the assist gas is high even at an ordinary temperature (a room temperature), and hence the desired pressure is not obtained by only the temperature control made by the reserver.

In the unit for supplying the gases, the vacuum gauge 18 measures the pressure of the buffer 16, and the control valve 17 controls the pressure of the buffer 16 so as for the pressure of the buffer 16 to be constant. In such a way, the gas unit supplies the gases. In this case as well, the surface of the specimen 9 is sprayed with the gases, which are controlled on the basis of the pressure control, from the gas gun 11 through the valve 21.

In addition, high resistors 20 each having a high resistance value are inserted into lens cables distributed between the control power source 13 for ion optics system and the condenser lens 2 and between the control power source 13 and the objective lens 5, respectively. Each of the resistors 20 has a high resistance value of 600 MΩ to 10 GΩ, and due to the provision of those resistors 20, the discharge is generated in the form of the glow discharge. In addition, if the discharge should be generated between the condenser lens 2 or the objective lens 5 and the earth, then the amount of current which is caused to flow through the control power source 13 for ion optics can be reduced to a value equal to or smaller than 50 μA. If the resistance value of each of the resistors 20 is equal to or lower than 600 MΩ, then the discharge is generated in the form of the spark discharge so that each of the lenses 2 and 5, and the control power source are damaged. In addition, if the resistance value of each of the resistors 20 is 10 GΩ, then the responsibility (the focus responsibility) of the applied voltages which are respectively applied to the lenses 2 and 5 becomes poor, and hence the resistors 20 in this case can not be used.

As set forth hereinabove, according to the present invention, in the above-mentioned system, each of the lenses 2 and 5 is made of a material which is excellent in corrosion resistance (for example, hastelloy alloy) or the surface treatment is carried out therefor, whereby the corrosion resistance against the assist gases is increased and hence discharge is hardly generated therein. While in the case where the normal material is employed therefor, the corrosion is generated and hence the discharge is generated after a lapse of 1 to 2 weeks or so, in accordance with the present invention, the generation of the corrosion can be suppressed for years.

In addition, the high resistors 20 are inserted into the lens cable in order to regulate the current which is caused to flow therethrough when the discharge is generated. When the voltage which is applied to the lenses is 30 kV, by inserting the resistors 20 each having a resistance value of several GΩ, the dark current can be reduced to several tens of μA or so, and as a result the destruction of the control unit is not caused.

What is claimed is:

1. A focused ion beam system comprising:
   a focusing lens for focusing an ion beam emitted from an ion source;
   scanning electrodes for applying the focused ion beam onto a predetermined area on a surface of a specimen while scanning the predetermined area on the surface of the specimen with the focused ion beam;
   a secondary charged particle detector for detecting secondary charged particles which are generated from the surface of the specimen in response to application of the focused ion beam thereonto;
   a display device for displaying thereon an image of the surface of the specimen on the basis of signals output by the secondary charged particle detector;
   and a gas gun for spraying the surface of the specimen with gases;
   wherein the focusing lens is made of a material which has corrosion resistance against a halogen series gas.

2. A focused ion beam system according to claim 1; wherein the material of the focusing lens is hastelloy alloy.

3. A focused ion beam system according to claim 1; wherein the material of the focusing lens is stellite alloy.

4. A focused ion beam system comprising:
   a focusing lens for focusing an ion beam emitted from an ion source onto a predetermined area on a surface of a specimen while scanning the predetermined area on the surface of the specimen with the focused ion beam;
   a secondary charged particle detector for detecting secondary charged particles which are generated from the surface of the specimen in response to application of the focused ion beam thereonto;
   and a display device for displaying thereon an image of the surface of the specimen on the basis of signals output by the secondary charged particle detector;
   a control power source for applying a high voltage to the focusing lens;
   and a resistor disposed between the control power source and each individual lens of the focusing lens, the resistor having a resistance value high enough so that in the event discharge occurs between the focusing lens and ground current flow due to discharge is limited so that the discharge is a glow discharge.

5. A focused ion beam system according to claim 4; wherein the focusing lens comprises a condenser lens and an objective lens.

6. A focused ion beam system according to claim 4; wherein the resistance value of each of the resistors is in the range of 600 MΩ to 10 GΩ.

7. In a system employing a focused ion beam impinging on an object surface, the improvement comprising:

a focusing lens for focusing the ion beam and being formed of a material resistant to corrosion by a halogen series gas.

8. A system according to claim 7; wherein the focusing lens is formed of hastelloy alloy.

9. A system according to claim 7; wherein the focusing lens is formed of stellite alloy.

10. A system according to claim 7; wherein the focusing lens comprises plural lenses, each being formed of hastelloy alloy.

11. A system according to claim 7; wherein the focusing lens comprises plural lenses, each being formed of stellite alloy.

12. A system according to claim 7; wherein the focusing lens comprises a condenser lens and an objective lens, each lens being formed of hastelloy alloy.

13. A system according to claim 7; wherein the focusing lens comprises a condenser lens and an objective lens, each lens being formed of stellite alloy.

14. A system according to claim 7; wherein the focusing lens is formed of a metallic material and is covered by a film formed of a material resistant to corrosion by a halogen series gas.

15. A system according to claim 14; wherein the film is formed of a material selected from the group consisting of titanium nitride, silicon carbide and a noble metal.

16. A system according to claim 14; wherein the focusing lens comprises a condenser lens and an objective lens, each lens having the film formed thereon.

17. A system according to claim 16; wherein the film is formed of a material selected from the group consisting of titanium nitride, silicon carbide and a noble metal.

18. A system according to claim 7; further comprising scanning electrodes for controlling the location on the object surface at which the focused ion beam impinges and being controllable to cause the focused ion beam to scan across a predetermined area on the object surface.

19. A system according to claim 7; further comprising a secondary charged particle detector for detecting secondary charged particles emanating from the object surface in response to application of the focused ion beam thereto and producing a corresponding output signal; and a display device for displaying an image of the object surface in accordance with the output signal of the secondary charged particle detector.

20. A system according to claim 7; further comprising a gas gun for spraying the object surface with a halogen series gas.

* * * * *